US012191859B2

(12) United States Patent
Goyal et al.

(10) Patent No.: US 12,191,859 B2
(45) Date of Patent: Jan. 7, 2025

(54) SYSTEM AND METHOD FOR CONTROLLING TUNING IN ELECTRONIC CIRCUITRIES

(71) Applicant: NXP B.V., Eindhoven (NL)

(72) Inventors: Saurabh Goyal, Sonipat (IN); Divya Tripathi, Noida (IN); Krishna Thakur, GautamBudh Nagar (IN); Deependra Kumar Jain, Noida (IN)

(73) Assignee: NXP B.V., Eindhoven (NL)

( * ) Notice: Subject to any disclaimer, the term of this patent is extended or adjusted under 35 U.S.C. 154(b) by 47 days.

(21) Appl. No.: 18/332,042

(22) Filed: Jun. 9, 2023

(65) Prior Publication Data

US 2024/0204757 A1  Jun. 20, 2024

(30) Foreign Application Priority Data

Dec. 14, 2022  (IN) .............................. 202221072345

(51) Int. Cl.
*H03K 3/017* (2006.01)
*H03K 3/03* (2006.01)
*H03K 5/135* (2006.01)

(52) U.S. Cl.
CPC ........... *H03K 3/017* (2013.01); *H03K 3/0315* (2013.01); *H03K 5/135* (2013.01)

(58) Field of Classification Search
None
See application file for complete search history.

(56) References Cited

U.S. PATENT DOCUMENTS

| 9,231,597 B2 | 1/2016 | Ippolito et al. |
| 9,490,827 B2 | 11/2016 | Wang et al. |
| 9,960,798 B2 | 5/2018 | Kim et al. |
| 10,250,266 B2 | 4/2019 | Annema et al. |
| 11,003,203 B2 * | 5/2021 | Poon ......................... G06F 1/04 |
| 11,984,899 B2 * | 5/2024 | Chang ................... H03L 7/0893 |

* cited by examiner

*Primary Examiner* — Cassandra F Cox

(57) ABSTRACT

An integrated circuit including a functional circuit, a tuning circuit, and a control circuit is provided. The functional and control circuits generate an output signal and a digital code, respectively. The tuning circuit tunes the functional circuit based on the digital code to control an attribute of the output signal. The digital code is iteratively adjusted such that the attribute of the output signal is maintained within a predefined range. When the digital code corresponds to a cliff value, the digital code for a subsequent iteration is adjusted by a non-unit offset value such that a difference between the attribute for the cliff value and for the subsequent digital code is within a tolerance limit. The digital code is indicative of coarse and fine parameters, and for each value of the coarse parameter, the cliff value corresponds to the lowest or highest value of the fine parameter.

20 Claims, 4 Drawing Sheets

SYSTEM AND METHOD FOR CONTROLLING TUNING IN ELECTRONIC CIRCUITRIES

CROSS-REFERENCE TO RELATED APPLICATIONS

This application claims the priority under 35 U.S.C. § 119 of India application No. 202221072345, filed on 14 Dec. 2022, the contents of which are incorporated by reference herein.

BACKGROUND

Field of the Disclosure

The present disclosure relates generally to electronic circuitries, and, more particularly, to a system and a method for controlling tuning in electronic circuitries.

Description of the Related Art

An integrated circuit (IC) includes electronic circuitries that control operations of various critical components of the IC. The operations of the critical components may be controlled based on an attribute (e.g., a frequency, a duty cycle, a voltage, a current, or the like) of an output signal generated by electronic circuitry. For example, the IC may include a free-running oscillator (FRO) that may generate an output clock signal of the desired frequency for utilization by the critical components of the IC. However, the attribute of the output signal may change due to various factors such as process-voltage-temperature variations. Utilization of such an output signal may hamper the operations of the critical components of the IC.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION OF EMBODIMENTS

Overview

Figure 1:
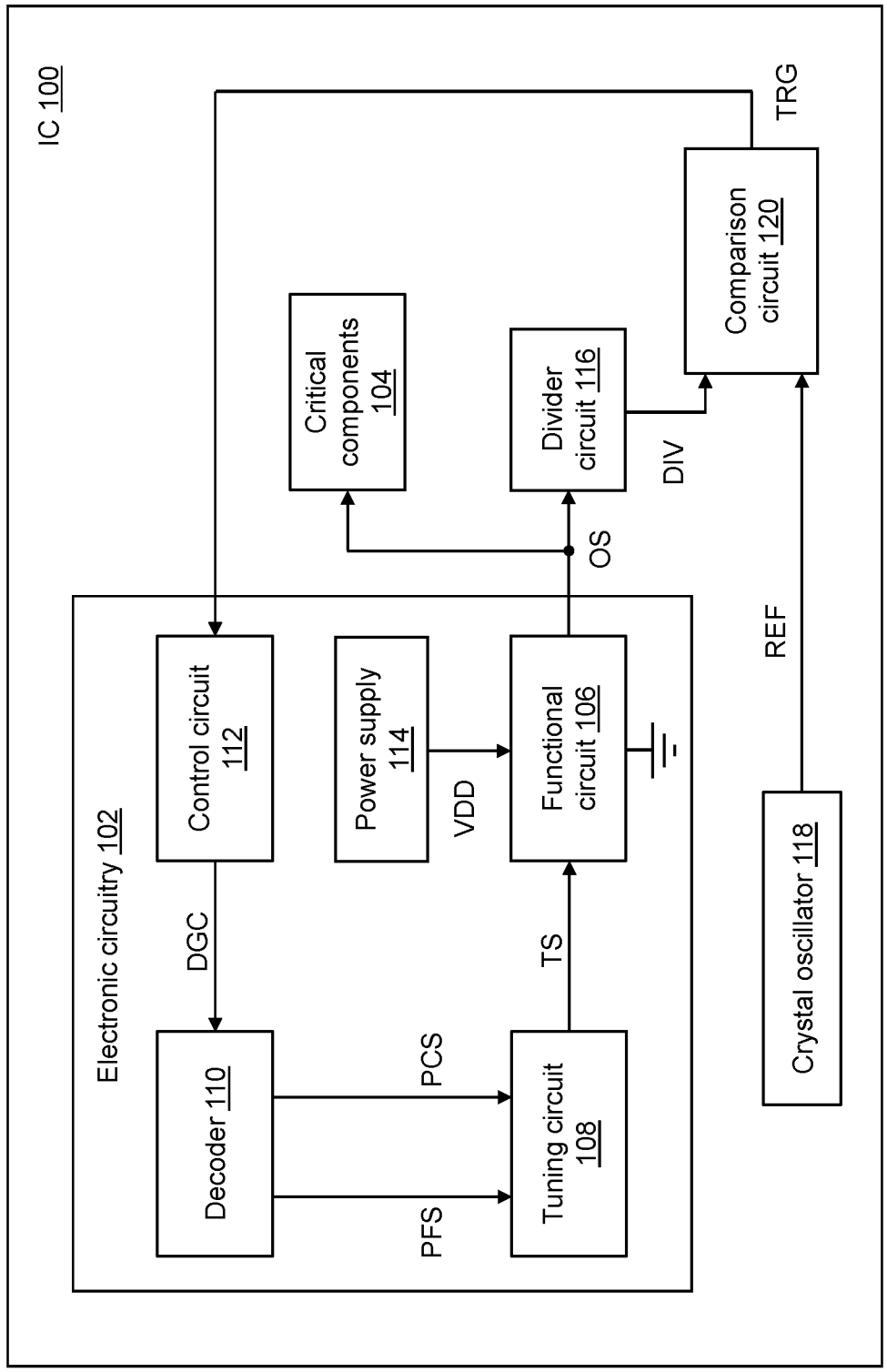
FIG. 1 illustrates a schematic block diagram of an integrated circuit (IC) in accordance with an embodiment of the present disclosure.

Conventionally, to improve the accuracy of electronic circuitries (e.g., free-running oscillators (FROs)) in an integrated circuit (IC), the electronic circuitries may be tuned. The tuning is triggered when it is determined that an attribute of an associated output signal has deviated from the desired range. Thus, the tuning corresponds to adjusting, based on a digital code, the attribute of the associated output signal until the attribute is within the desired range. For example, in an FRO, a frequency of an output clock signal is adjusted based on the digital code until the frequency is within the desired range. Typically, the tuning is controlled such that the digital code is iteratively incremented or decremented by a unit value and the attribute (e.g., the frequency) is adjusted in a non-linear manner. Thus, a graph of the attribute of the output signal against the digital code may correspond to a rising sawtooth wave. For example, when the digital code corresponds to a cliff value (e.g., a peak of the rising sawtooth wave), the frequency may be equal to 300 megahertz (MHz), whereas, after the increment, the frequency may change to 260 MHz. In other words, the frequency range of 260-300 MHz may be associated with two different sets of digital code values (e.g., on either side of the cliff value). Such tuning results in significant variations in the attribute of the output signal after the cliff values. As a result, operations of critical components of the IC, that utilize the output signal, are affected. Further, the tuning time is significant as some values of the attribute are repeated.

Various embodiments of the present disclosure disclose an IC including electronic circuitry. The electronic circuitry may include a functional circuit, a tuning circuit, and a control circuit. The functional circuit may generate an output signal. The tuning circuit may tune the functional circuit based on a digital code to control an attribute of the output signal. The attribute corresponds to a frequency, a voltage, a current, a duty cycle, or the like. The control circuit may generate the digital code. The control circuit thus controls the tuning in the electronic circuitry. The digital code may be iteratively adjusted such that the attribute of the output signal is maintained within a predefined range. When the digital code corresponds to a non-cliff value, the digital code is adjusted by a unit value. Further, when the digital code corresponds to a cliff value, the digital code is adjusted by an offset value such that a difference between the attribute of the output signal for the cliff value and for the digital code of the subsequent iteration is within a tolerance limit (e.g., is zero). The offset value is different from the unit value. The digital code is indicative of a coarse parameter and a fine parameter, and for each coarse value of the coarse parameter, the cliff value corresponds to an initial fine value (e.g., the lowest fine value) of the fine parameter and a last fine value (e.g., the highest fine value) of the fine parameter.

Thus, in the present disclosure, during the tuning of the electronic circuitry, when the digital code corresponds to the cliff value, the digital code for the subsequent iteration is adjusted by the offset value instead of the unit value, with the attribute of the output signal for the adjusted digital code being equal to that for the cliff value. Thus, significant variations in the attribute of the output signal after the cliff values are mitigated. Therefore, operations of critical components of the IC, that utilize the output signal, may remain unaffected during the tuning of the electronic circuitry. Further, the tuning time in the present disclosure is significantly less than that in some conventional tuning techniques where the digital code is always adjusted by a unit value.

FIG. 1 illustrates a schematic block diagram of an integrated circuit (IC) 100 in accordance with an embodiment of the present disclosure. The IC 100 may be implemented in various devices such as automotive devices, networking devices, mobile devices, or the like. The IC 100 may include electronic circuitry 102 that may be configured to generate an output signal OS. Further, the IC 100 may include critical components 104 that may utilize the output signal OS for executing various operations thereof. The operations of the critical components 104 may be controlled based on an attribute of the output signal OS. The attribute of the output signal OS may correspond to a frequency, a voltage, a current, a duty cycle, or the like, of the output signal OS. For accurate operations of the critical components 104, it is paramount that the attribute of the output signal OS is within a desired range. Hence, when it is determined that the attribute of the output signal OS has deviated from the desired range, the electronic circuitry 102 may be tuned to iteratively adjust the attribute of the output signal OS until the attribute is within the desired range. Such tuning is implemented by various components within the electronic circuitry 102, and hence, is referred to as auto-tuning of the electronic circuitry 102.

The electronic circuitry 102 may correspond to any component of the IC 100 that may generate output signals for utilization by other components of the IC 100, and whose output (e.g., the output signal OS) may be tuned. In an exemplary embodiment, the electronic circuitry 102 corresponds to a free-running oscillator (FRO). In such a scenario, the output signal OS corresponds to an output clock signal, and a frequency of the output signal OS may be adjusted during the tuning of the electronic circuitry 102. The electronic circuitry 102 may include a functional circuit 106, a tuning circuit 108, a decoder 110, a control circuit 112, and a power supply 114. The power supply 114 may be configured to generate a supply voltage VDD.

The functional circuit 106 may be configured to generate the output signal OS. Thus, the tuning of the electronic circuitry 102 may correspond to the tuning of the functional circuit 106. The functional circuit 106 may be coupled to the power supply 114 and a ground terminal. The functional circuit 106 may be configured to receive the supply voltage VDD from the power supply 114, and the output signal OS may be generated based on the supply voltage VDD. Although not shown, the supply voltage VDD may further be provided to other components of the electronic circuitry 102 and the IC 100.

The tuning circuit 108 may be coupled to the functional circuit 106. The tuning circuit 108 may be configured to tune the functional circuit 106. Based on the tuning of the functional circuit 106, the attribute (e.g., the frequency) of the output signal OS is controlled. In an embodiment, the tuning circuit 108 corresponds to a coarse-and-fine-tuning implementation to execute a coarse-and-fine-tuning of the functional circuit 106. Thus, to tune the functional circuit 106, the tuning circuit 108 may be further configured to execute a coarse-tuning operation and a fine-tuning operation, generate a tuning signal TS based on the execution of the coarse-tuning and fine-tuning operations, and provide the tuning signal TS to the functional circuit 106. The functional circuit 106 may be tuned based on the tuning signal TS. In other words, the functional circuit 106 may generate the output signal OS further based on the tuning signal TS. The structure of the tuning circuit 108 and the functional circuit 106 may vary based on the type of the electronic circuitry 102. The tuning circuit 108 and the functional circuit 106 of the FRO are explained in detail in FIG. 2.

The decoder 110 may be coupled to the tuning circuit 108 and the control circuit 112. The decoder 110 may include suitable circuitry that may be configured to perform one or more operations. For example, the decoder 110 may be configured to facilitate the tuning of the functional circuit 106. The decoder 110 may be configured to receive a digital code DGC from the control circuit 112. The digital code DGC may control the tuning of the functional circuit 106. The digital code DGC may be indicative of a coarse parameter and a fine parameter. In an exemplary embodiment, the digital code DGC may be a 10-bit value, with the lower six bits, that include the least significant bit (LSB), corresponding to the fine parameter, and the remaining four bits, that include the most significant bit (MSB), corresponding to the coarse parameter. Such a digital code DGC may be utilized in the electronic circuitry 102 to facilitate the coarse-and-fine-tuning thereof.

The decoder 110 may be further configured to generate a plurality of fine control signals PFS and a plurality of coarse control signals PCS. The plurality of coarse control signals PCS may be generated based on the coarse parameter of the digital code DGC and the plurality of fine control signals PFS may be generated based on the fine parameter of the digital code DGC. In an embodiment, for a 6-bit fine parameter and a 4-bit coarse parameter, the decoder 110 may generate 64 fine control signals (e.g., a count of the plurality of fine control signals PFS is 64) and 16 coarse control signals (e.g., a count of the plurality of coarse control signals PCS is 16), respectively. Further, at any instance, exclusively a single fine control signal of the plurality of fine control signals PFS and a single coarse control signal of the plurality of coarse control signals PCS may be at a logic high state, and remaining fine and coarse control signals may be at a logic low state. For example, for a fine value of '0' and a coarse value of '0', initial fine and coarse control signals are at the logic high state. Similarly, for a coarse value of '14' and a fine value of '55', fifteenth coarse control signal and fifty-sixth fine control signal are at the logic high state.

The decoder 110 may be further configured to provide the plurality of fine control signals PFS and the plurality of coarse control signals PCS to the tuning circuit 108. The tuning circuit 108 may execute the fine-tuning and coarse-tuning operations based on the plurality of fine control signals PFS and the plurality of coarse control signals PCS, respectively. Thus, the fine-tuning operation may be executed based on the fine parameter of the digital code DGC and the coarse-tuning operation may be executed based on the coarse parameter of the digital code DGC.

The control circuit 112 may include suitable circuitry that may be configured to perform one or more operations. For example, the control circuit 112 may be configured to generate the digital code DGC. The electronic circuitry 102 (e.g., the functional circuit 106) may be tuned based on the digital code DGC. In other words, based on the digital code DGC, the attribute (e.g., the frequency) of the output signal OS may be controlled. The control circuit 112 thus controls the tuning in the electronic circuitry 102. Each value of the digital code DGC may be indicative of a value of the coarse parameter and a value of the fine parameter. The tuning circuit 108 may be implemented such that linear adjustment of the digital code DGC may result in a non-linear adjustment of the attribute (e.g., the frequency) of the output signal OS. In other words, the attribute of the output signal OS against the digital code DGC may result in a rising sawtooth wave.

The digital code DGC may thus have a plurality of cliff values. Each cliff value may correspond to a combination of the coarse and fine parameters. For each coarse value of the coarse parameter, the cliff value may correspond to an initial fine value of the fine parameter or a last fine value of the fine parameter. Thus, each coarse value of the coarse parameter may have two cliff values, namely, the lower cliff value that corresponds to the initial (e.g., the lowest) fine value and the upper cliff value that corresponds to the last (e.g., the highest) fine value. In an embodiment, for a 4-bit coarse parameter and a 6-bit fine parameter, the digital code DGC may have 32 cliff values. Thus, for a coarse value of '0', the lower cliff value may correspond to the fine value of '0' and the upper cliff value may correspond to the fine value of '63'. Therefore, the digital code DGC of '0' and '63' may correspond to cliff values. Similarly, for a coarse value of '4', the lower cliff value may correspond to the fine value of '0' and the upper cliff value may correspond to the fine value of '63'. Thus, the digital code DGC of '256' and '319' may correspond to cliff values. The plurality of cliff values may thus correspond to '0', '63', '64', '127', '128', '191', '192', '255', '256', '319', '320', '383', '384', '447', '448', '511', '512', '575', '576', '639', '640', '703', '704', '767', '768', '831', '832', '895', '896', '959', '960', and '1023'. The decimal equivalent of binary values is used to keep the description concise and clear.

The attribute of the output signal OS for a first set of non-cliff values prior to a cliff value overlaps with the attribute of the output signal OS for a second set of non-cliff values subsequent to the corresponding cliff value. The first set of non-cliff values corresponds to a first coarse value of the coarse parameter and a first set of fine values of the fine parameter, and the second set of non-cliff values corresponds to a second coarse value of the coarse parameter and a second set of fine values of the fine parameter. Further, the second coarse value is subsequent to the first coarse value. For example, the frequency of the output signal OS for values of '216' to '254' may overlap with the frequency of the output signal OS for values of '256' to '294', respectively. The values of '216' to '254' may correspond to the coarse value of '4' (e.g., resulting in the digital code DGC of ' 192') and fine values of '24' to '62'. Similarly, the values of '256' to '294' may correspond to the coarse value of '5' (e.g., resulting in the digital code DGC of '256') and fine values of '0' to '38'. The frequency of the output signal OS for the digital code DGC of '255' and '256' may thus be significantly different. In an example, if the frequency of the output signal OS for the digital code DGC of '255' is 300 megahertz (MHz), the frequency of the output signal OS for the digital code DGC of '256' may be 260 MHz.

The control circuit 112 may be further configured to receive a trigger signal TRG. The attribute of the output signal OS may vary and fall outside the desired range due to various factors such as process-voltage-temperature (PVT) variations in the IC 100. The trigger signal TRG may indicate whether the attribute (e.g., the frequency) of the output signal OS is within the desired range. In other words, the trigger signal TRG may be indicative of the triggering of the tuning of the functional circuit 106. In an embodiment, a logic low state of the trigger signal TRG may indicate that the attribute of the output signal OS is within the desired range. Conversely, a logic high state of the trigger signal TRG may indicate that the attribute of the output signal OS is outside the desired range. The logic high state of the trigger signal TRG may thus trigger the tuning of the functional circuit 106.

The control circuit 112 may be further configured to initiate the iterative adjustment of the digital code DGC based on the trigger signal TRG (e.g., based on the logic high state of the trigger signal TRG). When the adjustment of the digital code DGC is initiated, the electronic circuitry 102 may continue to operate in a closed-loop mode. The triggering of the tuning of the functional circuit 106 may indicate that the current value of the digital code DGC is resulting in an inaccurate output of the electronic circuitry 102 (e.g., the output signal OS with an inaccurate frequency). Thus, the control circuit 112 may be further configured to adjust the digital code DGC in an iterative manner until the attribute (e.g., the frequency) of the output signal OS is within a predefined range (e.g., the desired range). The iterative update of the digital code DGC thus ensures that the attribute (e.g., the frequency) of the output signal OS is maintained within the predefined range (e.g., the desired range). The adjustment of the digital code DGC corresponds to an increment of the digital code DGC or a decrement of the digital code DGC.

The digital code DGC is adjusted such that when the digital code DGC corresponds to a non-cliff value, that is different from a cliff value, the digital code DGC for a subsequent iteration is adjusted by a unit value (e.g., '1'). Conversely, when the digital code DGC corresponds to a cliff value, the digital code DGC for the subsequent iteration is adjusted by an offset value. The offset value is different from the unit value. The offset value may be such that the difference between the attribute of the output signal OS for the cliff value and for the digital code DGC of the subsequent iteration is within a tolerance limit. In an example, the tolerance limit corresponds to 0.01% of the attribute of the output signal OS for the cliff value. However, the tolerance limit may have other values in other embodiments. In an exemplary embodiment, the offset value may be such that the attribute of the output signal OS for the cliff value and for the digital code DGC of the subsequent iteration may be equal. In the aforementioned scenario, after the digital code DGC of '255', the digital code DGC for the subsequent iteration may be '295' as the attribute (e.g., the frequency) of the output signal OS for both values may be equal. Thus, the offset value corresponds to a value of '40'. However, the offset value may be different in other embodiments. The adjustment of the digital code DGC by the offset value thus ensures that the attribute (e.g., the frequency) of the output signal OS is updated in a linear manner and discontinuities therein are mitigated.

Thus, when the tuning of the functional circuit 106 is triggered, the digital code DGC is adjusted in an iterative manner such that for a first set of iterations, the digital code DGC is adjusted by the unit value, with a last iteration of the first set of iterations resulting in the digital code DGC corresponding to the cliff value. Further, for a first iteration, that is subsequent to the first set of iterations, the digital code DGC is adjusted by the offset value. Additionally, for a second set of iterations, that is subsequent to the first iteration, the digital code DGC is adjusted by the unit value. The last iteration of the second set of iterations may result in the digital code DGC corresponding to another cliff value. The adjustment of the digital code DGC continues in an aforementioned manner until the attribute (e.g., the frequency) of the output signal OS is within the predefined range (e.g., the desired range).

The IC 100 may further include a divider circuit 116, a crystal oscillator 118, and a comparison circuit 120 to enable the determination of whether the attribute (e.g., the frequency) of the output signal OS has deviated from the desired range.

The divider circuit 116 may be coupled to the electronic circuitry 102 (e.g., the functional circuit 106). The divider circuit 116 may include suitable circuitry that may be configured to perform one or more operations. For example, the divider circuit 116 may be configured to receive the output signal OS from the electronic circuitry 102 and generate a divided signal DIV. The divided signal DIV may be derived from the output signal OS such that an attribute (e.g., a frequency) of the divided signal DIV may be a scaled-down version of the attribute (e.g., the frequency) of the output signal OS. The crystal oscillator 118 may include suitable circuitry that may be configured to perform one or more operations. For example, the crystal oscillator 118 may be configured to generate a reference signal REF. An attribute of the reference signal REF may be used as a reference value for determining whether the attribute of the output signal OS has deviated from the desired range.

The comparison circuit 120 may be coupled to the crystal oscillator 118, the divider circuit 116, and the control circuit 112. The comparison circuit 120 may include suitable circuitry that may be configured to perform one or more operations. For example, the comparison circuit 120 may be configured to receive the reference signal REF from the crystal oscillator 118 and the divided signal DIV from the divider circuit 116. Further, the comparison circuit 120 may be configured to compare the attribute of the divided signal DIV and the attribute of the reference signal REF.

Based on the comparison of the attribute of the divided signal DIV and the attribute of the reference signal REF, the comparison circuit 120 may be further configured to determine whether the attribute of the output signal OS is within the predefined range. Additionally, the comparison circuit 120 may be configured to generate the trigger signal TRG and provide the trigger signal TRG to the control circuit 112. In an embodiment, the trigger signal TRG may be at the logic high state based on the difference between the attribute of the divided signal DIV and the attribute of the reference signal REF being greater than a threshold value. Conversely, the trigger signal TRG may be at the logic low state based on the difference between the attribute of the divided signal DIV and the attribute of the reference signal REF being less than or equal to the threshold value. In an example, the threshold value may correspond to 0.1% of the attribute (e.g., the frequency) of the reference signal REF. However, the threshold value may be different in other embodiments.

The attribute of the output signal OS may be divided by a scaling factor associated with the divider circuit 116 to enable the comparison with the attribute of the reference signal REF. The scaling factor may be such that the comparison of the attributes of the divided and reference signals DIV and REF may indicate whether the attribute of the output signal OS is within the predefined range. The tuning of the functional circuit 106 is triggered based on the determination that the attribute of the output signal OS is outside the predefined range. The predefined range may thus be a function of the threshold value and the scaling factor. In an example, the predefined range may include values within 0.1% of the product of the scaling factor and the attribute of the reference signal REF. However, the predefined range may be different in other embodiments. In an exemplary scenario, the frequency of the reference signal REF is 40 MHz and the scaling factor is 5. Thus, the threshold value may correspond to 400 kilohertz (kHz), and the predefined range may correspond to values of 199.8 to 200.2 MHz.

When the electronic circuitry 102 corresponds to an FRO, each of the reference signal REF, the output signal OS, and the divided signal DIV may correspond to a clock signal. In such a scenario, the comparison circuit 120 compares the frequency of the divided signal DIV and the frequency of the reference signal REF to determine whether the frequency of the output signal OS is within the predefined range.

Although it is described that the electronic circuitry 102 includes the tuning circuit 108, the decoder 110, the control circuit 112, and the power supply 114, the scope of the present disclosure is not limited to it. In other embodiments, one or more of such components may be external to the electronic circuitry 102, without deviating from the scope of the present disclosure.

Figure 2:
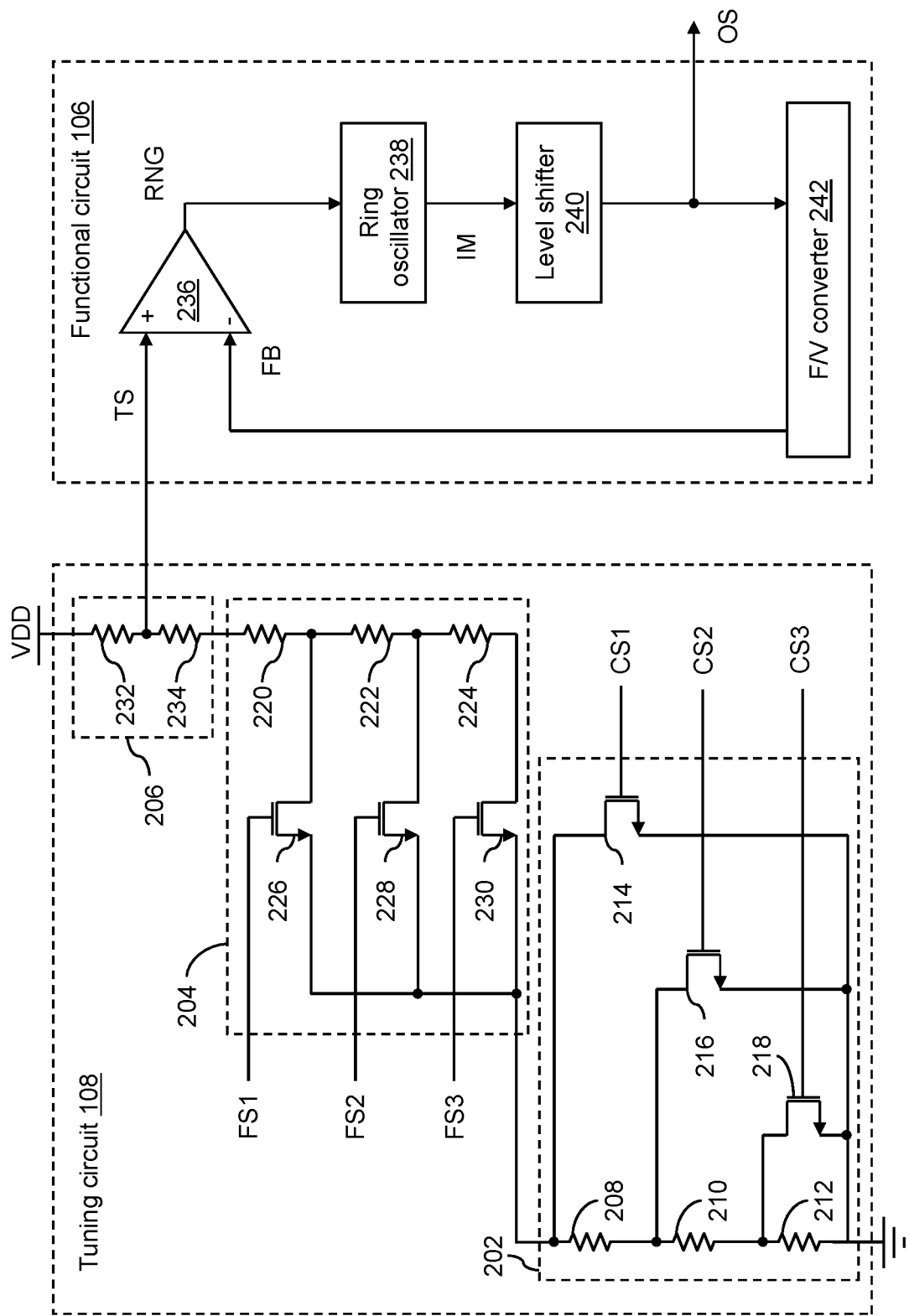
FIG. 2 illustrates schematic circuit diagrams of a tuning circuit and a functional circuit of the IC of FIG. 1 in accordance with an embodiment of the present disclosure.

FIG. 2 illustrates schematic circuit diagrams of the tuning and functional circuits 108 and 106 in accordance with an embodiment of the present disclosure.

The tuning circuit 108 may include a coarse-tuning circuit 202, a fine-tuning circuit 204, and a resistor circuit 206. The coarse-tuning circuit 202 may include a first plurality of series-coupled resistors, of which first through third resistors 208-212 are shown, and a plurality of coarse transistors, of which first through third coarse transistors 214-218 are shown. Similarly, the fine-tuning circuit 204 may include a second plurality of series-coupled resistors, of which fourth through sixth resistors 220-224 are shown, and a plurality of fine transistors, of which first through third fine transistors 226-230 are shown. Hereinafter, the first plurality of series-coupled resistors may be referred to as the "first plurality of series-coupled resistors 208-212" and the plurality of coarse transistors may be referred to as the "plurality of coarse transistors 214-218". Similarly, the second plurality of series-coupled resistors may be referred to as the "second plurality of series-coupled resistors 220-224" and the plurality of fine transistors may be referred to as the "plurality of fine transistors 226-230". Additionally, the resistor circuit 206 may include a seventh resistor 232 and an eighth resistor 234.

Each of the first through eighth resistors 208, 210, 212, 220, 222, 224, 232, and 234 may include a first terminal and a second terminal. In an example, the resistance value of each of the first through third resistors 208-212 is equal to 10.7 kilo-ohms, the resistance value of each of the fourth through sixth resistors 220-224 is equal to 538 ohms, and the resistance values of the seventh and eighth resistors 232 and 234 are equal to 150 kilo-ohms and 75 kilo-ohms, respectively. However, the resistance values may be different in other embodiments. Further, each of the first through third coarse transistors 214-218 and each of the first through third fine transistors 226-230 may include first and second conductive terminals and a control terminal. In an embodiment, each of the first through third coarse transistors 214-218 and the first through third fine transistors 226-230 is an n-channel metal-oxide-semiconductor (NMOS) transistor, with the first and second conductive terminals corresponding to source and drain terminals, respectively, and the control terminal corresponding to a gate terminal.

The first and second terminals of the second resistor 210 may be coupled to the second and first terminals of the first and third resistors 208 and 212, respectively. The second terminal of the third resistor 212 may be coupled to the ground terminal. Further, the source terminal of the first coarse transistor 214 may be coupled to the source terminal of each remaining coarse transistor (e.g., the second and third coarse transistors 216 and 218), and further coupled to the ground terminal. The drain terminals of the first through third coarse transistors 214-218 may be coupled to the first terminals of the first through third resistors 208-212, respectively. In other words, the drain terminals of the first through third coarse transistors 214-218 may be coupled to a node of the first plurality of series-coupled resistors 208-212.

The gate terminals of the first through third coarse transistors 214-218 may be coupled to the decoder 110, and configured to receive first through third coarse control signals CS1-CS3, respectively, that control activation and deactivation thereof. Thus, the plurality of coarse control signals PCS may include the first through third coarse control signals CS1-CS3, and the decoder 110 may be further configured to provide the plurality of coarse control signals PCS to the gate terminals of the first through third coarse transistors 214-218. As the first through third coarse transistors 214-218 correspond to NMOS transistors, the first through third coarse transistors 214-218 may be activated based on the logic high state of the first through third coarse control signals CS1-CS3, respectively. In an embodiment, at any instance, exclusively a single coarse control signal of the plurality of coarse control signals PCS may be at the logic high state. As a result, at any instance, exclusively a single coarse transistor of the plurality of coarse transistors 214-218 may be activated, and the remaining coarse transistors may be deactivated. In other words, for each coarse value, exclusively a single coarse transistor may be activated.

The first and second terminals of the fifth resistor 222 may be coupled to the second and first terminals of the fourth and sixth resistors 220 and 224, respectively. Further, the source terminal of the first fine transistor 226 may be coupled to the source terminal of each remaining fine transistor (e.g., the second and third fine transistors 228 and 230), and further coupled to the first plurality of series-coupled resistors 208-212 (e.g., the first terminal of the first resistor 208). The drain terminals of the first through third fine transistors 226-230 may be coupled to the second terminals of the fourth through sixth resistors 220-224, respectively. In other words, the drain terminals of the first through third fine transistors 226-230 may be coupled to a node of the second plurality of series-coupled resistors 220-224.

The gate terminals of the first through third fine transistors 226-230 may be coupled to the decoder 110, and configured to receive first through third fine control signals FS1-FS3, respectively, that control activation and deactivation thereof. Thus, the plurality of fine control signals PFS may include the first through third fine control signals FS1-FS3, and the decoder 110 may be further configured to provide the plurality of fine control signals PFS to the gate terminals of the first through third fine transistors 226-230. As the first through third fine transistors 226-230 correspond to NMOS transistors, the first through third fine transistors 226-230 may be activated based on the logic high state of the first through third fine control signals FS1-FS3, respectively. In an embodiment, at any instance, exclusively a single fine control signal of the plurality of fine control signals PFS may be at the logic high state. As a result, at any instance, exclusively a single fine transistor of the plurality of fine transistors 226-230 may be activated, and the remaining fine transistors may be deactivated. In other words, when the digital code DGC corresponds to the cliff value, an initial fine transistor (e.g., the first fine transistor 226) or a last fine transistor (e.g., the third fine transistor 230) is activated. Thus, the first and third fine transistors 226 and 230 may be activated for the initial and last fine values of the fine parameter, respectively. Conversely, when the digital code DGC corresponds to the non-cliff value, any of the remaining fine transistors (e.g., the second fine transistor 228) is activated.

The plurality of coarse transistors 214-218, the plurality of fine transistors 226-230, the first plurality of series-coupled resistors 208-212, and the second plurality of series-coupled resistors 220-224 are shown to include three transistors and three resistors to make the illustrations concise and clear and should not be considered a limitation of the present disclosure. The number of coarse transistors and resistors included in the coarse-tuning circuit 202 may be different in other embodiments and may be dependent on the coarse parameter of the digital code DGC. For example, if the coarse parameter of the digital code DGC corresponds to a 4-bit value, 16 coarse transistors and 16 series-coupled resistors may be included in the coarse-tuning circuit 202. In such a scenario, for each coarse value, one of the 16 coarse transistors may be activated. Similarly, the number of fine transistors and resistors included in the fine-tuning circuit 204 may be different in other embodiments and may be dependent on the fine parameter of the digital code DGC. For example, if the fine parameter of the digital code DGC corresponds to a 6-bit value, 64 fine transistors and 64 series-coupled resistors may be included in the fine-tuning circuit 204. In such a scenario, when the digital code DGC corresponds to the cliff value, an initial fine transistor or a last fine transistor may be activated, and when the digital code DGC corresponds to the non-cliff value, any of the remaining fine transistors may be activated.

The first terminal of the seventh resistor 232 may be coupled to the power supply 114, and configured to receive the supply voltage VDD, whereas, the second terminal of the eighth resistor 234 may be coupled to the first terminal of the fourth resistor 220. Further, the second terminal of the seventh resistor 232 may be coupled to the first terminal of the eighth resistor 234. In other words, the seventh and eighth resistors 232 and 234 may correspond to a pair of series-coupled resistors. Further, the tuning signal TS may be generated at a node corresponding to the second and first second terminals of the seventh and eighth resistors 232 and 234. As at any instance one of the first through third coarse transistors 214-218 is activated and one of the first through third fine transistors 226-230 is activated, the tuning circuit 108 may correspond to a voltage divider that controls a voltage level of the tuning signal TS. The voltage drops facilitated by the coarse-tuning and fine-tuning circuits 202 and 204 may correspond to the coarse-tuning and fine-tuning operations of the tuning circuit 108, respectively. In other words, the tuning signal TS may be coarsely tuned by the coarse-tuning circuit 202, and the fine-tuning of the tuning signal TS may be executed by the fine-tuning circuit 204. Thus, the resistor circuit 206 may be configured to receive the supply voltage VDD and generate the tuning signal TS, with the voltage level of the tuning signal TS being controlled based on the plurality of fine control signals PFS and the plurality of coarse control signals PCS.

The resistor circuit 206 is shown to include a pair of series-coupled resistors to make the illustrations concise and clear and should not be considered a limitation of the present disclosure. In other embodiments, more than two resistors coupled in series may be included in the resistor circuit 206.

The functional circuit 106 may include an amplifier 236, a ring oscillator 238, a level shifter 240, and a frequency-to-voltage (F/V) converter 242. The amplifier 236 may be coupled to the tuning circuit 108 (e.g., the second and first terminals of the seventh and eighth resistors 232 and 234) and the F/V converter 242. The amplifier 236 and the F/V converter 242 may be coupled in a negative feedback configuration. In other words, the F/V converter 242 may be coupled to a negative input terminal of the amplifier 236, whereas, the tuning circuit 108 may be coupled to a positive input terminal of the amplifier 236. The ring oscillator 238 may be coupled between the amplifier 236 and the level shifter 240, and the level shifter 240 may be further coupled to the F/V converter 242.

Each of the amplifier 236, the ring oscillator 238, the level shifter 240, and the F/V converter 242 may include suitable circuitry that may be configured to perform one or more operations. For example, the amplifier 236 may be configured to receive the tuning signal TS and a feedback signal FB from the tuning circuit 108 and the F/V converter 242, respectively. The amplifier 236 may be further configured to generate a ring supply signal RNG based on a difference between the voltage level of the tuning signal TS and a voltage level of the feedback signal FB and provide the ring supply signal RNG to the ring oscillator 238. The ring oscillator 238 may be configured to generate an intermediate clock signal IM based on a voltage level of the ring supply signal RNG and provide the intermediate clock signal IM to the level shifter 240. The level shifter 240 may be configured to level-shift the intermediate clock signal IM and generate the output signal OS. In other words, the output signal OS is a level-shifted version of the intermediate clock signal IM. Thus, the output signal OS is generated based on the tuning signal TS and the feedback signal FB, and the attribute of the output signal OS may be adjusted based on the voltage level of the tuning signal TS (e.g., by adjusting the voltage level of the tuning signal TS). The F/V converter 242 may be configured to receive the output signal OS from the level shifter 240 and generate the feedback signal FB based on the output signal OS. In an example, the voltage level of the feedback signal FB is controlled based on the frequency of the output signal OS. Further, the F/V converter 242 may be configured to provide the feedback signal FB to the amplifier 236.

Although not shown, the functional circuit 106 may include various other components (e.g., capacitors, bias circuits, or the like) that facilitate the generation of the output signal OS, without deviating from the scope of the present disclosure.

The scope of the present disclosure is not limited to the tuning of the frequency of the output clock signal of the FRO. In various other embodiments, the electronic circuitry 102 may correspond to a different component and the attribute of the output signal OS may correspond to a different attribute, without deviating from the scope of the present disclosure.

Figure 3:
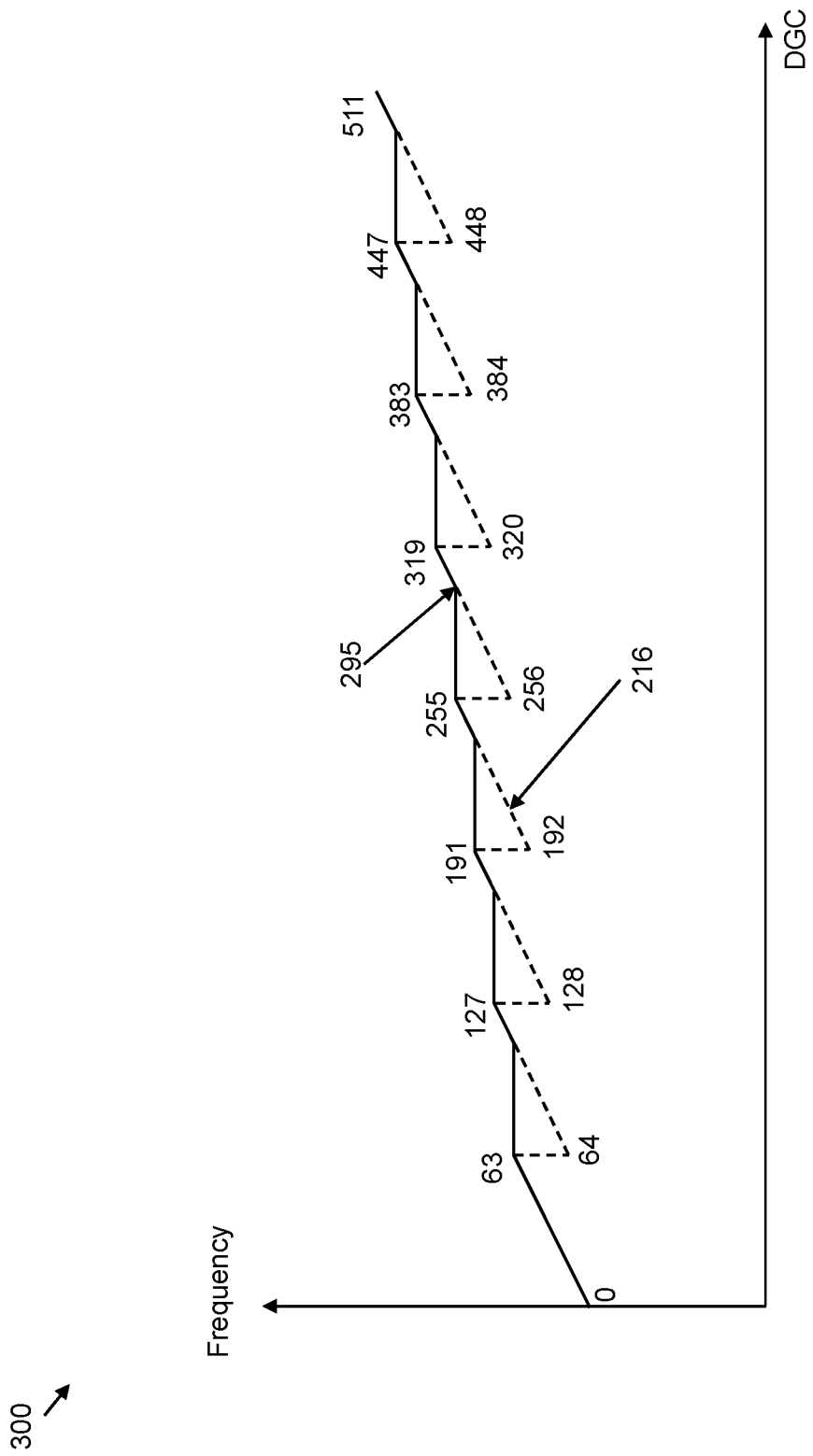
FIG. 3 represents a graph that illustrates tuning of electronic circuitry of the IC of FIG. 1 in accordance with an embodiment of the present disclosure.

FIG. 3 represents a graph 300 that illustrates the tuning of the electronic circuitry 102 in accordance with an embodiment of the present disclosure. The graph 300 depicts the relation between the digital code DGC and the attribute (e.g., the frequency) of the output signal OS.

The tuning circuit 108 may be implemented such that linear adjustment of the digital code DGC results in the non-linear adjustment of the frequency of the output signal OS. Thus, the graph 300 of the frequency of the output signal OS against the digital code DGC corresponds to the rising sawtooth wave. The digital code DGC may thus have the plurality of cliff values. For the sake of ongoing discussion, it is assumed that the coarse parameter is a 4-bit parameter and the fine parameter is a 6-bit parameter. In such a scenario, the digital code DGC may have 32 cliff values (e.g., 16 lower cliff values and 16 upper cliff values). For the sake of simplicity, exclusively the cliff values of '0', '63', '64', '127', '128', '191', '192', '255', '256', '319', '320', '383', '384', '447', '448', and '511' are illustrated in the graph 300. As illustrated in the graph 300, for each cliff value, the frequency of the output signal OS for the first set of non-cliff values prior to the corresponding cliff value overlaps with the attribute of the output signal OS for the second set of non-cliff values subsequent to the corresponding cliff value. For example, the frequency of the output signal OS for values of '216' to '254' may overlap with the frequency of the output signal OS for values of '256' to '294', respectively.

In some conventional techniques, a digital code (such as the digital code DGC) is iteratively adjusted always by the unit value. In such cases, after the value '255', the digital code value for the subsequent iteration is '256' (as illustrated by dotted lines in the graph 300). As illustrated in FIG. 3, such tuning results in significant variations in the frequency after the cliff values. As a result, operations of critical components that utilize such an output signal may be affected. Further, the tuning time is significant as some values of the attribute are repeated.

In the present disclosure, when the tuning of the functional circuit 106 is triggered, for non-cliff values, the digital code DGC is adjusted by the unit value and for cliff values, the digital code DGC is adjusted by the offset value (as shown by solid lines in the graph 300). For example, when the tuning is triggered, if the digital code DGC corresponds to a value of '210', the digital code DGC may be updated in the following manner. For the first set of iterations (e.g., 45 iterations), the digital code DGC is adjusted by the unit value. At the end of the forty-fifth iteration, the digital code DGC corresponds to a cliff value of '255'. For the subsequent iteration, the digital code DGC is adjusted by the offset value of '40', thereby resulting in the value of '295'. As illustrated in FIG. 3, the attribute of the output signal OS for the values of '255' and '295' may be equal. Additionally, for the next 24 iterations (e.g., the second set of iterations) the digital code DGC is adjusted by the unit value, at the end of which the digital code DGC corresponds to another cliff value of '319'. The adjustment of the digital code DGC continues until the frequency of the output signal OS is within the predefined range. Thus, significant variations in the frequency after the cliff values may be mitigated in the present disclosure, thereby ensuring that the operations of the critical components 104 may remain unaffected. Further, the tuning time is significantly reduced as values of the attribute are not repeated.

The scope of the present disclosure is not limited to the offset value being such that the digital code DGC is adjusted to a value of an adjacent ramp (e.g., from '255' to '295'). In other embodiments, the adjusted digital code DGC may correspond to a value of a second ramp, a third ramp, or any other ramp, with respect to the current cliff value of the digital code DGC, without deviating from the scope of the present disclosure. In each case, the attribute of the output signal OS for the adjusted digital code DGC may be within the tolerance limit of that for the cliff value.

The adjustment illustrated in the graph 300 corresponds to the increment of the digital code DGC. In other embodiments, the digital code DGC may also be adjusted by decrementing the digital code DGC. In such a scenario, when the digital code DGC corresponds to lower cliff values, the digital code DGC for the subsequent iteration is decremented by the offset value of '40'. For example, when the digital code DGC corresponds to a lower cliff value of '256', the digital code DGC for the subsequent iteration is decremented to the value of '216'.

The type of adjustment may be determined based on the deviation of the attribute (e.g., the frequency) of the output signal OS from the predefined range. For example, if the current value of the attribute of the output signal OS is less than the attribute values included in the predefined range, the digital code DGC may be incremented for each iteration, whereas, if the current value of the attribute of the output signal OS is greater than the attribute values included in the predefined range, the digital code DGC may be decremented for each iteration. In an exemplary embodiment, the comparison circuit 120 may additionally provide, to the control circuit 112, a status signal (not shown) that indicates whether the current value of the attribute of the output signal OS is greater than or less than the attribute values included in the predefined range. The status signal may indicate that the current value of the attribute is greater than the attribute values included in the predefined range when the attribute of the divided signal DIV is greater than that of the reference signal REF by the threshold value. Conversely, the status signal may indicate that the current value of the attribute is less than the attribute values included in the predefined range when the attribute of the divided signal DIV is less than that of the reference signal REF by the threshold value.

Figure 4:
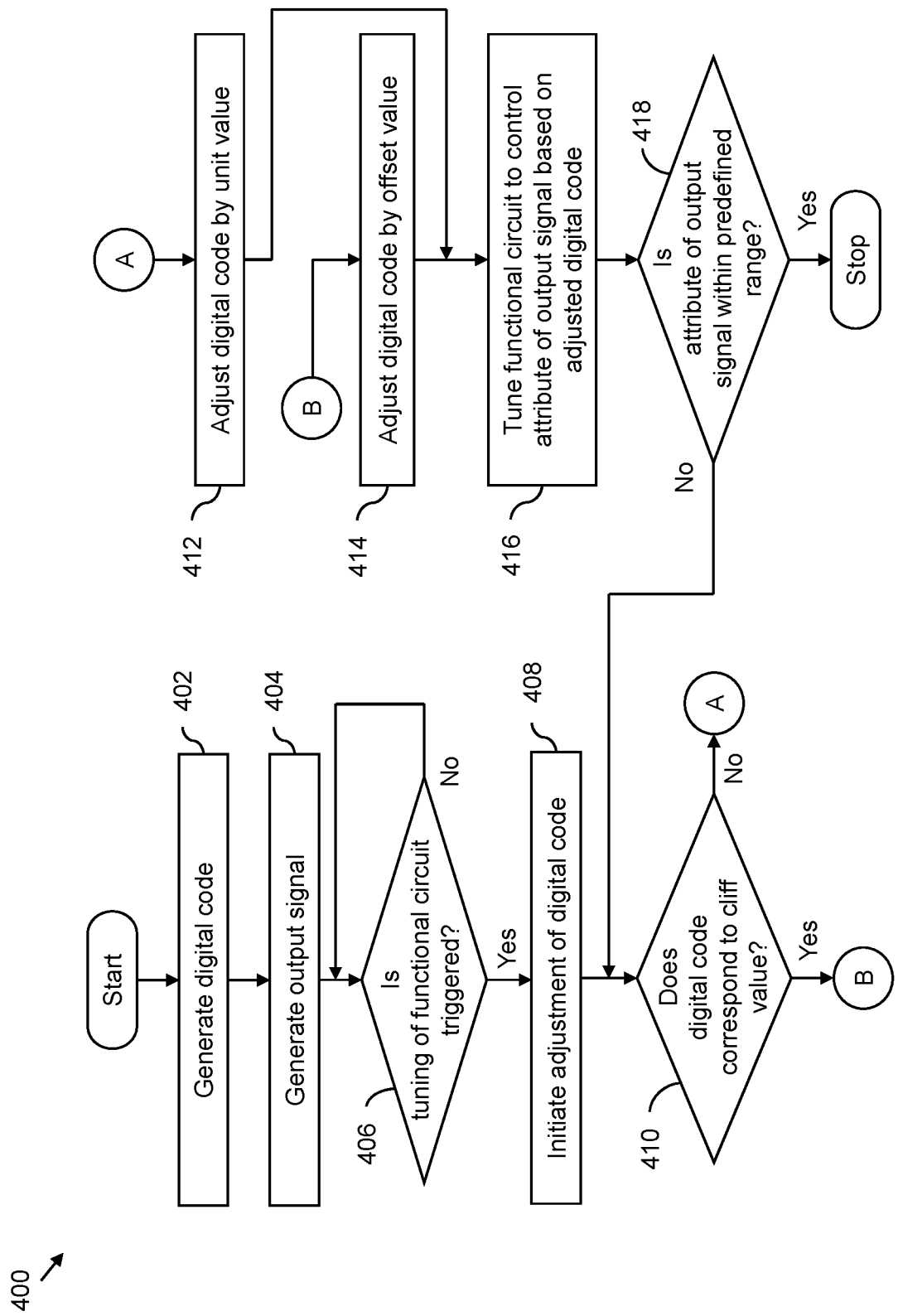
FIG. 4 represents a flowchart that illustrates a tuning control method for the electronic circuitry of the IC of FIG. 1 in accordance with an embodiment of the present disclosure.

FIG. 4 represents a flowchart 400 that illustrates a tuning control method for the electronic circuitry 102 in accordance with an embodiment of the present disclosure.

At step 402, the control circuit 112 may generate the digital code DGC. At step 404, the functional circuit 106 may generate the output signal OS. The output signal OS may be generated based on the tuning signal TS, which in turn is generated based on the plurality of fine control signals PFS and the plurality of coarse control signals PCS that are derived from the digital code DGC. Thus, the output signal OS may be generated based on the digital code DGC. The digital code DGC may control the attribute (e.g., the frequency) of the output signal OS. At step 406, the control circuit 112 may determine whether the tuning of the functional circuit 106 is triggered. The attribute of the output signal OS is required to be within the desired range, and the tuning of the functional circuit 106 may be triggered when it is determined that the attribute has deviated from the desired range. If at step 406, it is determined that the tuning is not triggered, step 406 is repeated. In other words, the control circuit 112 may not execute any operation and wait until the tuning is triggered. If at step 406, it is determined that the tuning is triggered, step 408 is performed.

At step 408, the control circuit 112 may initiate the adjustment of the digital code DGC. At step 410, the control circuit 112 may determine whether the digital code DGC corresponds to the cliff value. If at step 410, it is determined that the digital code DGC corresponds to the non-cliff value, step 412 is performed. At step 412, the control circuit 112 may adjust the digital code DGC by the unit value. Step 416 may be performed after step 412. Conversely, if at step 410, it is determined that the digital code DGC corresponds to the cliff value, step 414 is performed. At step 414, the control circuit 112 may adjust the digital code DGC by the offset value. Step 416 may be performed after step 414.

At step 416, the tuning circuit 108 may tune, based on the adjusted digital code DGC, the functional circuit 106 to control the attribute of the output signal OS. At step 418, the comparison circuit 120 may determine whether the attribute of the output signal OS is within the predefined range. If at step 418, it is determined that the attribute is not within the predefined range, step 410 is performed. If at step 418, it is determined that the attribute is within the predefined range, the control circuit 112 may halt the adjustment of the digital code DGC.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, the IC 100 is disclosed. The IC 100 may include the functional circuit 106, the tuning circuit 108, and the control circuit 112. The functional circuit 106 may be configured to generate the output signal OS. The tuning circuit 108 may be configured to tune the functional circuit 106 based on the digital code DGC. Based on the tuning of the functional circuit 106, the attribute of the output signal OS is controlled. The control circuit 112 may be configured to generate the digital code DGC. The digital code DGC may be iteratively adjusted such that the attribute of the output signal OS is maintained within the predefined range. When the digital code DGC corresponds to the cliff value, the digital code DGC for the subsequent iteration may be adjusted by the offset value, that is different from the unit value, such that the difference between the attribute of the output signal OS for the cliff value and for the digital code DGC of the subsequent iteration is within the tolerance limit. The digital code DGC may be indicative of the coarse parameter and the fine parameter, and for each coarse value of the coarse parameter, the cliff value may correspond to one of a group consisting of the initial fine value of the fine parameter and the last fine value of the fine parameter.

In another embodiment of the present disclosure, the tuning control method is disclosed. The tuning control method may include generating the digital code DGC by the control circuit 112, generating the output signal OS by the functional circuit 106, and tuning, by the tuning circuit 108, the functional circuit 106 based on the digital code DGC. Based on the tuning of the functional circuit 106, the attribute of the output signal OS is controlled. Further, the tuning control method may include initiating, by the control circuit 112, based on triggering of the tuning of the functional circuit 106, the iterative adjustment of the digital code DGC. The digital code DGC is adjusted such that the attribute of the output signal OS is maintained within the predefined range. The tuning control method may further include determining whether the digital code DGC corresponds to the cliff value, by the control circuit 112. The digital code DGC may be indicative of the coarse parameter and the fine parameter, and for each coarse value of the coarse parameter, the cliff value may correspond to one of a group consisting of the initial fine value of the fine parameter and the last fine value of the fine parameter. The tuning control method may further include adjusting, by the control circuit 112 when the digital code DGC corresponds to the cliff value, the digital code DGC for the subsequent iteration by the offset value that is different from the unit value. The difference between the attribute of the output signal OS for the cliff value and for the digital code DGC of the subsequent iteration is within the tolerance limit.

In some embodiments, the attribute of the output signal OS may correspond to at least one of a group consisting of the frequency, the voltage, the current, and the duty cycle of the output signal OS.

In some embodiments, when the digital code DGC corresponds to the non-cliff value that is different from the cliff value, the digital code DGC is adjusted by the unit value. The adjustment of the digital code DGC may correspond to one of a group consisting of the increment of the digital code DGC and the decrement of the digital code DGC.

In some embodiments, the IC 100 may further include the comparison circuit 120 that may be configured to determine whether the attribute of the output signal OS is within the predefined range. The tuning of the functional circuit 106 may be triggered based on the determination that the attribute of the output signal OS is outside the predefined range.

In some embodiments, the control circuit 112 may be further configured to receive the trigger signal TRG that is indicative of the triggering of the tuning of the functional circuit 106. Further, the control circuit 112 may be configured to initiate the adjustment of the digital code DGC based on the trigger signal TRG.

In some embodiments, the comparison circuit 120 may be further configured to receive the reference signal REF and the divided signal DIV and compare the attribute of the reference signal REF and the attribute of the divided signal DIV. The divided signal DIV may be derived from the output signal OS such that the attribute of the divided signal DIV is a scaled-down version of the attribute of the output signal OS. The comparison circuit 120 may determine whether the attribute of the output signal OS is within the predefined range based on the comparison of the attributes of the reference and divided signals REF and DIV. The comparison circuit 120 may be further configured to generate the trigger signal TRG such that the trigger signal TRG is at a logic high state based on the difference between the attributes of the reference and divided signals REF and DIV being greater than the threshold value. The control circuit 112 may initiate the adjustment of the digital code DGC based on the logic high state of the trigger signal TRG.

In some embodiments, the IC 100 may further include a crystal oscillator 118, the electronic circuitry 102 (e.g., the FRO), and the divider circuit 116 coupled to the FRO. The crystal oscillator 118 may be configured to generate the reference signal REF. The FRO may include the functional circuit 106, the tuning circuit 108, and the control circuit 112, and may be configured to generate the output signal OS. The divider circuit 116 may be configured to receive the output signal OS and generate the divided signal DIV. Each of the reference, output, and divided signals REF, OS, and DIV may correspond to a clock signal. The comparison circuit 120 may compare the frequency of the divided signal DIV and the frequency of the reference signal REF to determine whether the frequency of the output signal OS is within the predefined range.

In some embodiments, the digital code DGC may be iteratively adjusted such that for the first set of iterations, the digital code DGC may be adjusted by the unit value, with a last iteration of the first set of iterations resulting in the digital code DGC corresponding to the cliff value. Further, for the first iteration, that is subsequent to the first set of iterations, the digital code DGC may be adjusted by the offset value. Additionally, for the second set of iterations, that is subsequent to the first iteration, the digital code DGC may be adjusted by the unit value. The adjustment of the digital code DGC may continue until the attribute of the output signal OS is within the predefined range.

In some embodiments, to tune the functional circuit 106, the tuning circuit 108 may be further configured to execute coarse-tuning and fine-tuning operations based on the coarse and fine parameters of the digital code DGC, respectively. Further, the tuning circuit 108 may be configured to generate the tuning signal TS based on the coarse-tuning and fine-tuning operations and provide the tuning signal TS to the functional circuit 106. The functional circuit 106 is tuned based on the tuning signal TS.

In some embodiments, the tuning circuit 108 may further include the first plurality of series-coupled resistors 208-212, the second plurality of series-coupled resistors 220-224, the plurality of fine transistors 226-230, and the plurality of coarse transistors 214-218. The plurality of coarse transistors 214-218 may be configured to receive the plurality of coarse control signals PCS that control activation and deactivation thereof. Each coarse transistor may include a first conductive terminal coupled to a first conductive terminal of each remaining coarse transistor, a control terminal configured to receive a coarse control signal of the plurality of coarse control signals PCS, and a second conductive terminal coupled to a node of the first plurality of series-coupled resistors 208-212. Further, the plurality of fine transistors 226-230 may be configured to receive the plurality of fine control signals PFS that control activation and deactivation thereof. Each fine transistor may include a first conductive terminal coupled to a first conductive terminal of each remaining fine transistor and further coupled to the first plurality of series-coupled resistors 208-212, a control terminal configured to receive a fine control signal of the plurality of fine control signals PFS, and a second conductive terminal coupled to a node of the second plurality of series-coupled resistors 220-224.

In some embodiments, the IC 100 may further include the decoder 110 that may be coupled to the control circuit 112, the plurality of fine transistors 226-230, and the plurality of coarse transistors 214-218. The decoder 110 may be configured to receive the digital code DGC and generate the plurality of coarse control signals PCS based on the coarse parameter of the digital code DGC and the plurality of fine control signals PFS based on the fine parameter of the digital code DGC. Further, the decoder 110 may be configured to provide the plurality of coarse control signals PCS to the plurality of coarse transistors 214-218 and the plurality of fine control signals PFS to the plurality of fine transistors 226-230.

In some embodiments, the tuning circuit 108 may further include the resistor circuit 206 that may be coupled to the second plurality of series-coupled resistors 220-224. The resistor circuit 206 may be configured to receive the supply voltage VDD and generate the tuning signal TS. Based on the plurality of fine control signals PFS, one of the plurality of fine transistors 226-230 may be activated and based on the plurality of coarse control signals PCS, one of the plurality of coarse transistors 214-218 may be activated, thereby resulting in the tuning circuit 108 corresponding to the voltage divider that controls the voltage level of the tuning signal TS. The attribute of the output signal OS may be adjusted based on the voltage level of the tuning signal TS.

In some embodiments, when the digital code DGC corresponds to the cliff value, one of a group consisting of the initial fine transistor of the plurality of fine transistors 226-230 and the last fine transistor of the plurality of fine transistors 226-230 may be activated. The initial fine transistor may be activated for the initial fine value of the fine parameter and the last fine transistor may be activated for the last fine value of the fine parameter.

In some embodiments, the functional circuit 106 may include the amplifier 236, the ring oscillator 238, the level shifter 240, and the F/V converter 242. The amplifier 236 may be configured to receive the tuning signal TS and the feedback signal FB and generate the ring supply signal RNG based on a difference between the voltage level of the tuning signal TS and the voltage level of the feedback signal FB. The ring oscillator 238 may be configured to generate the intermediate clock signal IM based on the ring supply signal RNG. The level shifter 240 may be configured to level-shift the intermediate clock signal IM and generate the output signal OS. Further, the F/V converter 242 may be configured to generate the feedback signal FB based on the output signal OS.

In some embodiments, the digital code DGC may have the plurality of cliff values. For each cliff value, the attribute of the output signal OS for the first set of non-cliff values prior to the corresponding cliff value may overlap with the attribute of the output signal OS for the second set of non-cliff values subsequent to the corresponding cliff value.

Thus, in the present disclosure, during the tuning of the electronic circuitry 102, when the digital code DGC corresponds to the cliff value, the digital code DGC for the subsequent iteration is adjusted by the offset value instead of the unit value, with the attribute of the output signal OS for the adjusted digital code DGC being equal to that for the cliff value. Thus, significant variations in the attribute of the output signal OS after the cliff values are mitigated. Therefore, operations of the critical components 104 of the IC 100, that utilize the output signal OS, remain unaffected during the tuning of the electronic circuitry 102. Further, the tuning time in the present disclosure is significantly less than that in some conventional tuning techniques where the digital code is always adjusted by a unit value. Additionally, in some other conventional tuning techniques, the tuning circuit may be implemented such that linear adjustment of digital codes results in linear adjustment of the attribute of associated output signals. However, such tuning circuits may include more resistors and of higher values than that included in the tuning circuit 108. Thus, the size and power consumption of the electronic circuitry 102 are significantly less than some electronic circuitries that include such tuning circuits.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

We claim:

1. An integrated circuit (IC), comprising:
 a functional circuit configured to generate an output signal;
 a tuning circuit configured to tune the functional circuit based on a digital code, wherein based on the tuning of the functional circuit, an attribute of the output signal is controlled; and
 a control circuit configured to generate the digital code, with the digital code being iteratively adjusted such that the attribute of the output signal is maintained within a predefined range,
  wherein when the digital code corresponds to a cliff value, the digital code for a subsequent iteration is adjusted by an offset value, that is different from a unit value, such that a difference between the attribute of the output signal for the cliff value and for the digital code of the subsequent iteration is within a tolerance limit, and
  wherein the digital code is indicative of a coarse parameter and a fine parameter, and for each coarse value of the coarse parameter, the cliff value corresponds to one of a group consisting of an initial fine value of the fine parameter and a last fine value of the fine parameter.

2. The IC of claim 1, wherein the attribute of the output signal corresponds to at least one of a group consisting of a frequency, a voltage, a current, and a duty cycle of the output signal.

3. The IC of claim 1, wherein when the digital code corresponds to a non-cliff value that is different from the cliff value, the digital code is adjusted by the unit value.

4. The IC of claim 3, wherein the adjustment of the digital code corresponds to one of a group consisting of an increment of the digital code and a decrement of the digital code.

5. The IC of claim 1, further comprising a comparison circuit that is configured to determine whether the attribute of the output signal is within the predefined range, wherein the tuning of the functional circuit is triggered based on the determination that the attribute of the output signal is outside the predefined range.

6. The IC of claim 5, wherein the control circuit is further configured to receive a trigger signal that is indicative of the triggering of the tuning of the functional circuit, and wherein the control circuit is configured to initiate the adjustment of the digital code based on the trigger signal.

7. The IC of claim 6, wherein the comparison circuit is further configured to:
 receive a reference signal and a divided signal, wherein the divided signal is derived from the output signal such that an attribute of the divided signal is a scaled-down version of the attribute of the output signal;
 compare an attribute of the reference signal and the attribute of the divided signal, wherein the comparison circuit determines whether the attribute of the output signal is within the predefined range based on the comparison of the attribute of the reference signal and the attribute of the divided signal; and
 generate the trigger signal such that the trigger signal is at a logic high state based on the difference between the attribute of the divided signal and the attribute of the reference signal being greater than a threshold value, wherein the control circuit initiates the adjustment of the digital code based on the logic high state of the trigger signal.

8. The IC of claim 7, further comprising:
 a crystal oscillator configured to generate the reference signal;
 a free-running oscillator that comprises the functional circuit, the tuning circuit, and the control circuit, and is configured to generate the output signal; and
 a divider circuit that is coupled to the free-running oscillator, and configured to receive the output signal and generate the divided signal, wherein each of the reference signal, the output signal, and the divided signal corresponds to a clock signal, and wherein the comparison circuit compares a frequency of the divided signal and a frequency of the reference signal to determine whether a frequency of the output signal is within the predefined range.

9. The IC of claim 1,
wherein the digital code is iteratively adjusted such that:
 for a first set of iterations, the digital code is adjusted by the unit value, with a last iteration of the first set of iterations resulting in the digital code corresponding to the cliff value,
 for a first iteration, that is subsequent to the first set of iterations, the digital code is adjusted by the offset value, and
 for a second set of iterations, that is subsequent to the first iteration, the digital code is adjusted by the unit value, and
wherein the adjustment of the digital code continues until the attribute of the output signal is within the predefined range.

10. The IC of claim 1, wherein to tune the functional circuit, the tuning circuit is further configured to:
- execute a coarse-tuning operation and a fine-tuning operation, wherein the fine-tuning operation is executed based on the fine parameter of the digital code and the coarse-tuning operation is executed based on the coarse parameter of the digital code;
- generate a tuning signal based on the fine-tuning operation and the coarse-tuning operation; and
- provide the tuning signal to the functional circuit, wherein the functional circuit is tuned based on the tuning signal.

11. The IC of claim 10, wherein the tuning circuit comprises:
- a first plurality of series-coupled resistors;
- a plurality of coarse transistors configured to receive a plurality of coarse control signals that control activation and deactivation thereof, wherein each coarse transistor comprises (i) a first conductive terminal coupled to a first conductive terminal of each remaining coarse transistor of the plurality of coarse transistors, (ii) a control terminal configured to receive a coarse control signal of the plurality of coarse control signals, and (iii) a second conductive terminal coupled to a node of the first plurality of series-coupled resistors;
- a second plurality of series-coupled resistors; and
- a plurality of fine transistors configured to receive a plurality of fine control signals that control activation and deactivation thereof, wherein each fine transistor comprises (i) a first conductive terminal coupled to a first conductive terminal of each remaining fine transistor of the plurality of fine transistors and further coupled to the first plurality of series-coupled resistors, (ii) a control terminal configured to receive a fine control signal of the plurality of fine control signals, and (iii) a second conductive terminal coupled to a node of the second plurality of series-coupled resistors.

12. The IC of claim 11, further comprising a decoder that is coupled to the control circuit, the plurality of fine transistors, and the plurality of coarse transistors, wherein the decoder is configured to (i) receive the digital code, (ii) generate the plurality of coarse control signals based on the coarse parameter of the digital code and the plurality of fine control signals based on the fine parameter of the digital code, and (iii) provide the plurality of coarse control signals to the plurality of coarse transistors and the plurality of fine control signals to the plurality of fine transistors.

13. The IC of claim 11,
- wherein the tuning circuit further comprises a resistor circuit that is coupled to the second plurality of series-coupled resistors, and configured to receive a supply voltage and generate the tuning signal,
- wherein based on the plurality of fine control signals, one of the plurality of fine transistors is activated, and based on the plurality of coarse control signals, one of the plurality of coarse transistors is activated, thereby resulting in the tuning circuit corresponding to a voltage divider that controls a voltage level of the tuning signal, and
- wherein the attribute of the output signal is adjusted based on the voltage level of the tuning signal.

14. The IC of claim 13, wherein when the digital code corresponds to the cliff value, one of a group consisting of an initial fine transistor of the plurality of fine transistors and a last fine transistor of the plurality of fine transistors is activated, and wherein the initial fine transistor is activated for the initial fine value of the fine parameter and the last fine transistor is activated for the last fine value of the fine parameter.

15. The IC of claim 10, wherein the functional circuit comprises:
- an amplifier configured to receive the tuning signal and a feedback signal and generate a ring supply signal based on a difference between a voltage level of the tuning signal and a voltage level of the feedback signal;
- a ring oscillator configured to generate an intermediate clock signal based on the ring supply signal;
- a level shifter configured to level-shift the intermediate clock signal and generate the output signal; and
- a frequency-to-voltage converter configured to generate the feedback signal based on the output signal.

16. The IC of claim 1, wherein the digital code has a plurality of cliff values, and wherein the attribute of the output signal for a first set of non-cliff values prior to each cliff value of the plurality of cliff values overlaps with the attribute of the output signal for a second set of non-cliff values subsequent to the corresponding cliff value.

17. A tuning control method, comprising:
- generating, by a control circuit, a digital code;
- generating, by a functional circuit, an output signal;
- tuning, by a tuning circuit, the functional circuit based on the digital code, wherein based on the tuning of the functional circuit, an attribute of the output signal is controlled;
- initiating, by the control circuit, based on triggering of the tuning of the functional circuit, iterative adjustment of the digital code, wherein the digital code is adjusted such that the attribute of the output signal is maintained within a predefined range;
- determining, by the control circuit, whether the digital code corresponds to a cliff value, wherein the digital code is indicative of a coarse parameter and a fine parameter, and for each coarse value of the coarse parameter, the cliff value corresponds to one of a group consisting of an initial fine value of the fine parameter and a last fine value of the fine parameter; and
- adjusting, by the control circuit, when the digital code corresponds to the cliff value, the digital code for a subsequent iteration by an offset value that is different from a unit value, wherein a difference between the attribute of the output signal for the cliff value and for the digital code of the subsequent iteration is within a tolerance limit.

18. The tuning control method of claim 17, wherein the attribute of the output signal corresponds to at least one of a group consisting of a frequency, a voltage, a current, and a dutycycle of the output signal.

19. The tuning control method of claim 17, further comprising adjusting, by the control circuit, the digital code by the unit value when the digital code corresponds to a non-cliff value that is different from the cliff value, and wherein the adjustment of the digital code corresponds to one of a group consisting of an increment of the digital code and a decrement of the digital code.

20. The tuning control method of claim 17, further comprising determining, by a comparison circuit, whether the attribute of the output signal is within the predefined range, wherein the tuning of the functional circuit is triggered based on the determination that the attribute of the output signal is outside the predefined range.

* * * * *